(12) United States Patent
Tandy et al.

(10) Patent No.: US 6,521,980 B1
(45) Date of Patent: Feb. 18, 2003

(54) CONTROLLING PACKAGING ENCAPSULANT LEAKAGE

(75) Inventors: Patrick W. Tandy, Boise, ID (US);
Joseph M. Brand, Boise, ID (US);
Brad D. Rumsey, Meridian, ID (US);
Steven R. Stephenson, Nampa, ID
(US); David J. Corisis, Meridian, ID
(US); Todd O. Bolken, Meridian, ID
(US); Edward A. Schrock, Boise, ID
(US); Brenton L. Dickey, Meridian, ID
(US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/679,095

(22) Filed: Oct. 4, 2000

Related U.S. Application Data

(62) Division of application No. 09/386,971, filed on Aug. 31, 1999, now Pat. No. 6,210,992.

(51) Int. Cl.[7] .............................................. H01L 23/48
(52) U.S. Cl. .................. 257/668; 257/738; 257/787; 257/784; 257/650
(58) Field of Search .................................. 257/667, 668, 257/687, 738, 787, 784

(56) References Cited

U.S. PATENT DOCUMENTS

| 4,218,701 | A | * | 8/1980 | Shirasaki ..................... 357/72 |
|---|---|---|---|---|
| 5,041,395 | A | * | 8/1991 | Steffen ........................ 437/206 |
| 5,661,086 | A | * | 8/1997 | Nakashima et al. ......... 257/668 |
| 5,677,566 | A | * | 10/1997 | King et al. .................. 257/666 |
| 5,763,939 | A | * | 6/1998 | Yamashita ................... 257/668 |
| 5,939,778 | A | * | 8/1999 | Boutin et al. ................ 257/678 |
| 6,013,948 | A | * | 1/2000 | Akram et al. ................ 257/698 |
| 6,023,098 | A | * | 2/2000 | Higashiguchi et al. ...... 257/712 |
| 6,093,970 | A | * | 7/2000 | Ohsawa et al. ............. 257/777 |
| 6,143,581 | A | * | 11/2000 | Johnson et al. ............... 438/26 |
| 6,146,924 | A | * | 11/2000 | Chang et al. ............... 438/126 |
| 6,218,731 | B1 | * | 4/2001 | Huang et al. ................ 257/738 |
| 6,246,114 | B1 | * | 6/2001 | Takahashi et al. .......... 257/696 |
| 6,252,298 | B1 | * | 6/2001 | Lee et al. .................... 257/668 |
| 6,288,444 | B1 | * | 9/2001 | Abe et al. .................... 257/712 |

\* cited by examiner

Primary Examiner—Jerome Jackson
Assistant Examiner—Lourdes Cruz
(74) Attorney, Agent, or Firm—Trop, Pruner & Hu, P.C.

(57) ABSTRACT

An integrated circuit package may be formed in part with an encapsulated region. Outflow of the encapsulant across critical electrical elements can be prevented by providing a cavity which collects encapsulant outflow between the region of encapsulation and the region where the critical components are situated. In one embodiment of the present invention, a surface may include a first portion covered by solder resist, having an area populated by bond pads, and a second portion which is encapsulated. Encapsulant flow over the bond pads is prevented by forming an opening in the solder resist proximate to the second portion to collect the encapsulant before it reaches the bond pads.

12 Claims, 2 Drawing Sheets

CONTROLLING PACKAGING ENCAPSULANT LEAKAGE

This is a divisional of prior application Ser. No. 09/386,971 filed Aug. 31, 1999 now U.S. Pat. No. 6,210,992.

BACKGROUND

This invention relates generally to packaging electronic components and in particular embodiments to encapsulating laminate packages.

Laminate packages may be made of alternating core material and conductive layers. The core acts as a stiffener and insulator while the conductive layers are etched to leave a trace for electrical purposes. The laminate structure may have a solder resist selectively screen printed onto specific areas of the structure for solder protection.

A laminate package may be encapsulated by enclosing the unencapsulated package inside two halves of a mold. At the juncture of the two mold faces, encapsulants sometimes leak forming what is known as flash. The encapsulant leaking between the two mold halves may actually contaminate the electrical components that come in contact with the encapsulant. Generally when this happens, the devices are deemed defective and the entire laminated package is discarded.

In some cases, the leakage of encapsulant material is a result of the bleeding out of the resin vehicle from the overall epoxy. See, Ireland, James E., "Epoxy Bleeding Out in Ceramic Chip Carriers," ISHM Journal, Vol. 5, No. 1. Regardless of whether the contamination occurs because of the bleed out of the resin vehicle from the overall adhesive or from the leakage of the overall resin itself, the effects of such leakage on electronic components may be catastrophic.

Thus, there is a need to prevent flash contamination of the electrical components of electrical packages and particularly for preventing such contamination in the course of encapsulating laminate packages.

SUMMARY

In accordance with one aspect, a process for encapsulating integrated circuits includes defining an encapsulation cavity about an integrated circuit die. The cavity is filled with an encapsulant. The outflow of encapsulant is controlled by providing a collection reservoir proximate to the cavity.

Other aspects are set forth in the accompanying specification and claims.

DETAILED DESCRIPTION

Figure 1:
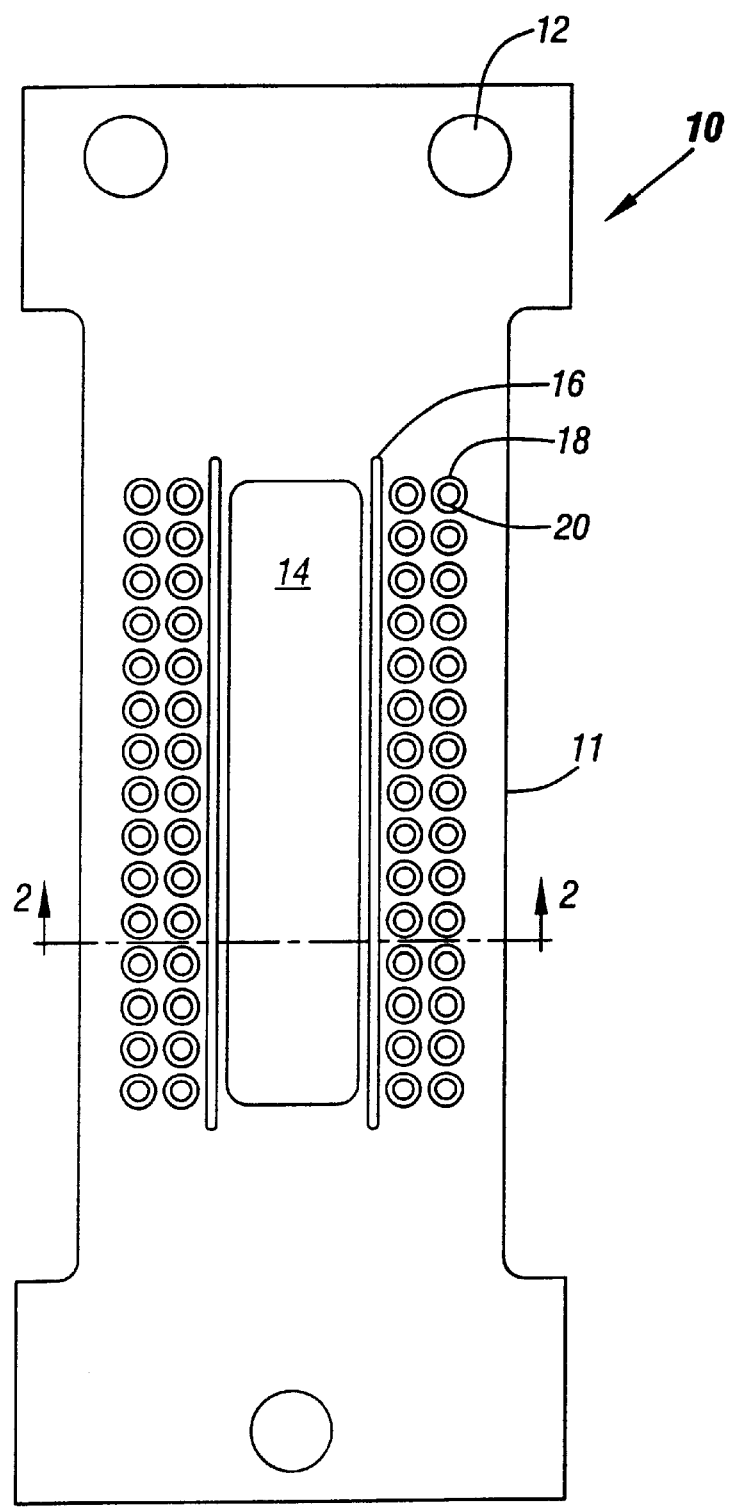
FIG. 1 is a greatly enlarged top plan view of one embodiment of the present invention.

Referring to FIG. 1, a laminate package 10 may include an I-shaped core 11 punctuated by alignment openings 12. A central encapsulated region 14 is bounded on either side by a flash cavity 16 and a plurality of ball pads 20. Each ball pad is situated inside the opening left in a solder resist coating whose extent is defined by the edges 18. Each of the cavities 16 basically provides an effective barrier to encapsulant intended to form the region 14. However, without the interposition of the cavities 16, encapsulant could extend outwardly from the region 14 and overflow onto the pads 20. This could result in contamination and possible destruction of the core 11.

Figure 2:
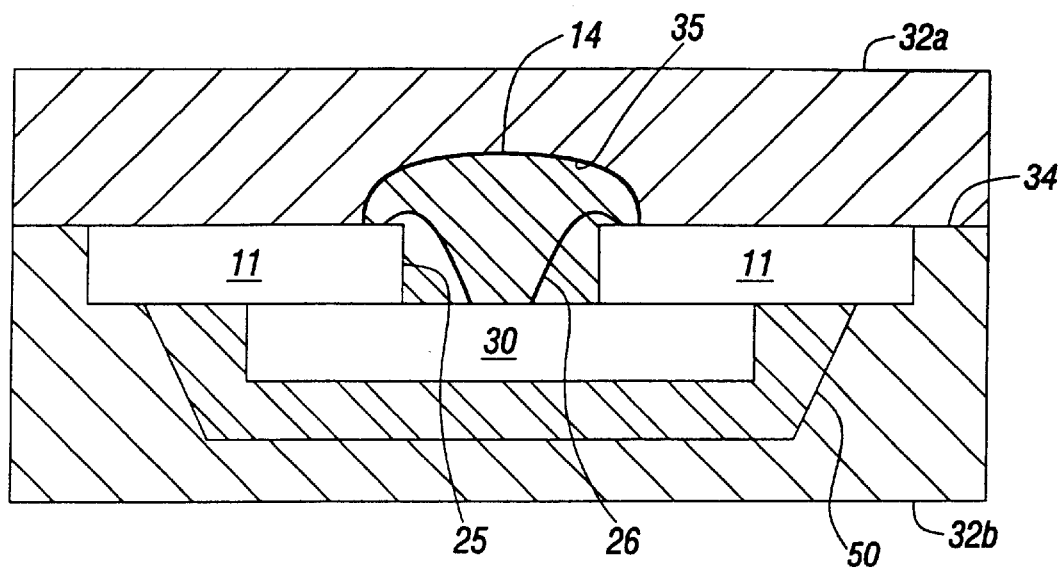
FIG. 2 is an enlarged cross-sectional view taken generally along the line 2—2 in FIG. 1 when the device shown in FIG. 1 is in position within an encapsulation mold.

Referring to FIG. 2, the core 11 may be affixed to an integrated circuit chip or die 30. Any conventional die affixation technique may be utilized. For example, the die 30 may be secured to the core 11 using adhesive, such as epoxy, adhesive tape such as lead-on-chip (LOC) tape or any other available technique. Wire bond wires 26 may make contact with contacts on the die 30 and extend upwardly to make electrical contact to corresponding contacts on the upper surface of the core 11. The bond wires 26 extend through the passage 25 which is filled with encapsulant 14.

The laminate package 10 may be encapsulated between two mold halves 32a and 32b. The mold halves define a parting line 34. The upper mold half 32a includes an elliptical chamber 35 which defines the encapsulated region 14.

While in the mold, the encapsulated region 14 is filled with an encapsulant. The encapsulant pots the bond wires 26 that are bonded on one end to the die 30 and extend upwardly to contact the upper surface of the core 11. The wires 26 make contact with contacts 24 (shown in FIG. 4) situated between a cavity 16 and the region 14.

Figure 3:
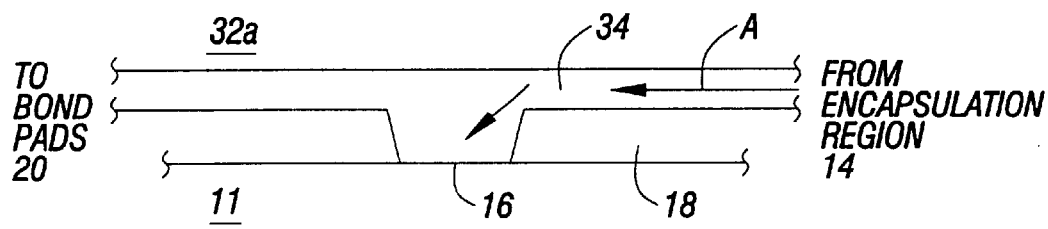
FIG. 3 is a greatly enlarged cross-sectional view of a portion of the device shown in FIG. 2 in the process of being molded.

Referring to FIG. 3, encapsulant "A" from the region 14 may tend to extend outwardly along the parting line 34. In such case, it flows over the solder resist 18 and into the cavity 16 defined in the solder resist 18. Thus, the cavity 16 provides a reservoir to collect the encapsulant overflow. The encapsulant readily fills the reservoir 16 because of its greater open area which provides pressure relief to the encapsulant which squeezes out between any slight gaps between the mold halves 32a and 32b. Thus, the encapsulant flows along the parting line 34 when the two mold halves 32a and 32b are not perfectly pressed together. The overflowing encapsulant then flows into the cavity 16 where it may be retained until it solidifies. In this way, the flow in the direction of the arrows A is blocked from extending to the pads 20 to the left in FIG. 3.

Because the cavity 16 may be simply formed by appropriate patterning of the solder resist 18, the provision of the cavities is relatively inexpensive if not cost free. Since apertures must be defined in the solder resist to form the edges 18 surrounding the bond pads 20, the pattern for the cavities 16 may be included at the same time. That is, the cavity 16 on either side of the encapsulated region 14 may be defined during the process of patterning the solder resist to form the openings that define the edges 18 around pads 20.

Figure 4:
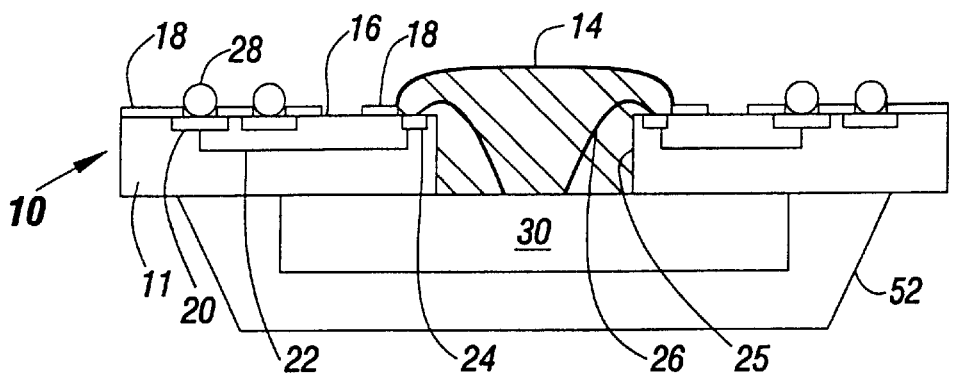
FIG. 4 is an enlarged cross-sectional view taken generally along the line 2—2 in the embodiment shown in FIG. 1 after the device has been completed by attaching solder balls.

Referring now to FIG. 4, which shows the device of FIG. 1 in cross-section after solder balls 28 have been positioned, the die 30 is overlaid by the laminate package 10 which has the central opening 25 which is filled with encapsulant. The upper surface of the encapsulated region 14 may have an elliptical configuration, in one example, because of the shape of the upper mold half 32a (FIG. 2). As a result, the bond wires 26, which extend from the die 30 up to the contacts 24 on the upper surface of the laminate package 10, are completely potted.

The mold half 32b may define a cavity 50 for encapsulating the die 30 as shown in FIG. 2. The encapsulation 52 then covers the die 30, as shown in FIG. 4.

The contacts 24 may electrically communicate, via traces 22 which extend through the core 11, with various pads 20. The pads 20 may in turn electrically couple to solder balls 28 in a conventional flip-chip or ball grid array packaging embodiment. Thus, the solder balls 28 are capable of communicating with the world outside of the package 10. In this way, the laminate package 10 provides a convenient interconnection medium for allowing the die 30 to communicate with external devices.

The solder resist includes the openings to define the edges 18 to allow for the imposition of the solder balls 28 as well as the openings which define the cavities 16 to receive any overflow of the encapsulant material. By positioning a cavity 16 between the encapsulated region 14 and the bond pads 20 for the solder balls 28, the critical electrical contact areas can be protected from contamination by encapsulant flash.

While non-solder mask defined pads (NSDP) are illustrated, solder mask defined pads (SDP) may be used as well. Although a laminate package is illustrated, other packaging configurations may be used as well including those using an interposer.

While the present invention has been described with respect to a limited number of embodiments, those skilled in the art will appreciate numerous modifications and. variations therefrom. It is intended that the appended claims cover all such modifications and variations as fall within the true spirit and scope of this present invention.

What is claimed is:

1. A laminate package for an integrated circuit die comprising:
   a first surface including a bond pad;
   a second surface beneath said first surface, said second surface including an interconnect coupled to said bond pad;
   a first region defined in said first and second surfaces to receive encapsulant; and
   a cavity defined in said first surface between a bond pad and said region in an area that is electrically isolated from said bond pad and said interconnect, said cavity adapted to collect encapsulant overflow from said region.

2. The laminate package of claim 1 including a laminate body, said first surface defined on said laminate body.

3. The laminate package of claim 1 including a body, said body covered by a solder resist layer, said solder resist layer defining said first surface.

4. The laminate package of claim 3 including a first opening in said solder resist layer for said bond pad.

5. The laminate package of claim 4 wherein said cavity is defined by a second opening in said solder resist layer.

6. The laminate package of claim 5 wherein said cavity is defined by an area where no solder resist exists over said laminate body.

7. The laminate package of claim 2 wherein said region is defined by an opening extending through said laminate body.

8. A laminate package comprising:
   a laminate core having an opening through said core from a first side of said core to a second side of said core;
   a die coupled to said core on said first side of said core;
   a bond pad defined on said second side of said core; and
   an encapsulation flash receiving cavity between said bond pad and said opening, said cavity defined in said laminate core in an area that is electrically isolated from said bond pad.

9. The package of claim 8 including a solder resist material on said second side, said solder resist material having a first opening for said bond pad.

10. The package of claim 9 including a second opening in said solder resist to define said cavity.

11. The package of claim 10 including wire bond wires extending from said die to said second side of said core.

12. The package of claim 11 including at least one bond pad on either side of said opening, and at least one cavity positioned on each side of said opening between said opening and said at least one bond pad.

* * * * *